United States Patent [19]

Washburn, Jr.

[11] Patent Number: 4,679,247
[45] Date of Patent: Jul. 7, 1987

[54] FM RECEIVER
[75] Inventor: Clyde Washburn, Jr., Cincinnati, Ohio
[73] Assignee: Cincinnati Microwave, Inc., Cincinnati, Ohio
[21] Appl. No.: 717,250
[22] Filed: Mar. 27, 1985
[51] Int. Cl.$^4$ .......................... H04B 1/16; H03D 3/24
[52] U.S. Cl. .................................. 455/210; 329/134; 329/136
[58] Field of Search ............... 455/210, 211, 308, 309; 329/131–134, 136

[56] References Cited

U.S. PATENT DOCUMENTS

| | | |
|---|---|---|
| 2,086,566 | 7/1937 | McCaa . |
| 2,388,200 | 10/1945 | Wilmotte . |
| 2,401,214 | 5/1946 | Worcester, Jr. . |
| 2,438,501 | 3/1948 | Hings . |
| 2,525,151 | 10/1950 | Stenning . |
| 2,617,019 | 11/1952 | Hepp . |
| 2,687,476 | 8/1954 | Guanella . |
| 2,927,997 | 3/1960 | Day . |
| 2,969,459 | 1/1961 | Hern . |
| 3,193,771 | 7/1965 | Boatwright . |
| 3,217,237 | 11/1965 | Boatwright . |
| 3,320,544 | 5/1967 | Deman . |
| 3,531,731 | 9/1970 | Matsuura et al. . |
| 3,611,169 | 10/1971 | Hess et al. . |
| 3,792,357 | 2/1974 | Hekimian et al. . |
| 3,832,638 | 8/1974 | Ohashi et al. ........................ 329/132 |
| 3,867,707 | 2/1975 | Pering et al. . |
| 3,909,725 | 9/1975 | Baghdady . |
| 3,911,366 | 10/1975 | Baghdady . |
| 4,035,730 | 7/1977 | Clayton . |
| 4,079,330 | 3/1978 | Ishigake et al. . |
| 4,101,837 | 7/1978 | Clayton, Jr. et al. . |
| 4,189,755 | 2/1980 | Balbes et al. . |
| 4,316,108 | 2/1982 | Rogers, Jr. . |
| 4,328,590 | 5/1982 | Lee . |
| 4,339,828 | 7/1982 | Chasek . |
| 4,408,350 | 10/1983 | Donath . |
| 4,584,596 | 4/1986 | Mobley . |
| 4,641,181 | 2/1987 | Mobley . |

OTHER PUBLICATIONS

CCIR Recommendation 567, Recommendations and Reports of the CCIR, 1982, XVth Plenary Assembly, Geneva 1982 (International Telecommunication Union) and EIA Standard RS 250-B, pp. 30, 32.
E. J. Baghdady, Chapter Four, "The Theory of Feedback Around the Limiter".
A. W. Emmons, "The Employment of Feedback in Frequency Modulation Receivers to Reject Interference", S. M. Thesis, Dept. of Electrical Engineering, M.I.T.; Jan. 1956.
J. B. Wiesner and E. J. Baghdady, "VIII. Multipath Transmission", pp. 42–49 of Quarterly Progress Report, Research Laboratory of Electronics, M.I.T.; Apr. 15, 1956.
E. J. Baghdady, "Theory of Feedback Around the Limiter", 1957 IRE Natl. Convention Record, pt. 8, pp. 176–202.
L. D. Shapiro, "Interference and Noise Rejection in F.M. Receivers", S. M. Thesis, Dept. of Electrical Engineering, M.I.T.; May 20, 1957.
R. J. McLaughlin, "A Study of FM Capture Effects", S. M. Thesis, Dept. of Electrical Engineering, M.I.T.; Jun. 1, 1958.
K. P. Luke, "The Locking and Interference Suppression Characteristics of an Oscillating Limiter", S. M. Thesis, Dept. of Electrical Engineering, M.I.T.; Sep. 5, 1958.

(List continued on next page.)

Primary Examiner—Robert L. Griffin
Assistant Examiner—Curtis Kuntz
Attorney, Agent, or Firm—Wood, Herron & Evans

[57] ABSTRACT

An improved FM receiver is disclosed incorporating improved oscillating limiter circuitry having an electrically tunable bandpass filter and variable attenuator in regenerative feedback relationship around the limiter. The electrically tunable bandpass filter is responsive to DC components and high frequency noise components of the demodulated video baseband signal. The variable attenuator is responsive to the carrier-to-noise ratio of the received FM signal whereby the amount of regenerative feedback around the limiter will vary inversely proportional to charges in the carrier-to-noise ratio.

16 Claims, 5 Drawing Figures

OTHER PUBLICATIONS

E. J. Baghdady, "FM Interference and Noise-Suppression Properties of the Oscillating Limiter", *IRE Trans on Vehicular Transactions*, vol. VC-13, pp. 13-39; Sep 1959.

E. J. Baghdady, "A Technique for Lowering the Noise Threshold of Conventional Frequency, Phase and Envelope Demodulators", *IRE Trans. on Communication Systems*, vol. CS-9, pp. 194-206; Sep., 1961.

E. J. Baghdady, "Dynamics of a Signal-Squelched Oscillating Limiter", *Proceedings of the IEEE*, pp. 492-493; Mar. 1963.

E. J. Baghdady, "Noise Threshold Reduction with the Oscillating Limiter", *Proceedings of the IEEE*, pp. 493-495; Mar., 1963.

R. Y. Huang, "An Analysis of the Oscillating Limiter'-'*IEEE Trans. on Space Electronics and Telemetry*, vol. VSET-9, n. 3, pp. 67-70; Sep. 1963.

E. Bozzoni and U. Mengali, "Comparison Between The Oscillating Limiter and the First-Order Phase-Locked Loop", *Proceedings of the IEEE*, vol. 56, n. 11, p. 2094; Nov., 1963.

E. Bozzoni and U. Mengali, "A General Analysis of the Performance of the Oscillating Limiter with Noiseless Signals", *IEEE Trans. of Communication Technology*, vol. COM-14, n. 5, pp. 578-588; Oct., 1966.

E. Bozzoni and U. Mengali, "Experimental Verification of a Model of the Oscillating Limiter", *IEEE Trans. on Communication Technology*, vol. COM-15, n. 6, pp. 865-867; Dec., 1976.

E. Bozzoni and U. Mengali, "An Analysis of the Performance of the Oscillating Limiter Driven by FM Signals Corrupted by Noise", *IEEE Trans. on Aerospace and Electronic Systems*, vol. AES-5, n. 3, pp. 537-547; May, 1969.

E. Bozzoni and U. Mengali, "Correction to 'An Analysis of the Performance of the Oscillating Limiter Driven by FM Signals Corrupted by Noise', ", *IEEE Trans. on Aerospace and Electronic Systems;* Nov., 1969.

Scientific Atlanta Receiver, Series 6600, Video Demodulator Circuit.

FM RECEIVER

This invention relates to FM receivers, and particularly to FM receivers adapted to receive weak signals in the presence of noise such as encountered in reception of signals transmitted via satellite. Specifically, the present invention relates to receivers for satellite transmitted television signals utilizing noise threshold extension circuitry of the oscillating limiter type.

Television or information signals may be frequency modulated onto a carrier signal of predetermined frequency. The resulting FM signal is of a particular bandwidth centered about the frequency of the carrier signal. The FM signal is transmitted from an earth-bound transmitter to a satellite and subsequently retransmitted from the satellite to earth receiving stations. The earth receiving station might normally include a reflector antenna configured to receive the satellite signal. The reflector antenna is coupled to a low noise amplifier which is further coupled to an FM receiver. The FM receiver is designed to demodulate the television signal from the carrier signal. The resultant demodulated, or baseband, signal is then provided to a television monitor for viewing, for example.

In communications systems employing satellites as part of the communications link, the information component of the FM signal appearing at the input to the receiver of the earth receiving station is typically extremely weak and accompanied by a substantial amount of electrical noise. This condition is caused, in part, by the fact the signal transmitted by the satellite transmitter must travel a great distance to reach the earth-bound receiver. As a result, the strength of the information portion of the signal received may be extremely weak. Compounding the difficulty of receiving such weak signals is the unavoidable addition of terrestrial noise to the signal due to objects with non-zero noise temperature in the view of the reflector antenna. Objects with non-zero noise temperature are sources of electrical noise which can be received by the reflector antenna. In addition to the terrestrial noise, a variety of other unavoidable electrical noise sources are commonly encountered in satellite communication systems. The net effect is that the receiver must extract an extremely weak information signal in the presence of strong noise if satisfactory results are to be achieved.

The FM signal received at the reflector antenna of the earth receiving station must be demodulated in order to be utilized, such as by a television monitor for viewing. To that end, the FM receiver will typically heterodyne, super heterodyne, or otherwise mix the signal received at the antenna dish with one or more local oscillator signals to produce an intermediate frequency (IF) FM signal which can more easily be operated upon by conventional receiver circuitry. The IF signal is still an FM signal, albeit at a lower frequency as is well understood. In television satellite communication systems, the IF signal may typically be centered about 70 MHz with a bandwidth of approximately 30 MHz, i.e., about 55 MHz to 85 MHz.

The IF signal is subsequently coupled to a demodulator or detector where it is demodulated to produce the original modulating or baseband signal. In a television satellite transmission system, the baseband signal is, ideally, 0 to 8.5 MHz and includes the video, audio subcarrier and related signals only. Within the baseband, the continuous video region from below 30 Hz to 4.2 MHz is of primary interest in the demodulation of 525 line television formats, such as NTSC, whereas for 625 line television format, such as PAL, the continuous video region of primary interest is from below 25 Hz to 5.0 MHz. The region lying between the upper end of the video baseband (4.2 MHz or 5.0 MHz) to the typical baseband upper limit of 8.5 MHz is normally used for the transmission of relatively narrowband FM subcarriers, a common format having the same transmission parameters as broadcast FM transmissions. These subcarriers are normally detected by suitable narrowband detectors, and because of the reduced bandwidth typically associated therewith, are more resistant to the effects of noise.

In reality, due to the nature of the satellite communication system involved as discussed above and the essentially triangular spectral distribution of noise in the baseband, the baseband or demodulated signal will likely also contain a great deal of noise, particularly at the higher end of the band. Such noise can degrade picture quality and/or audio fidelity and may even preclude reception of the information content of the signal.

In FM communications systems, the information signal (here the television signal) modulates the carrier signal resulting in an FM signal whose frequency will vary about the carrier frequency while, ideally, the amplitude of the signal will not vary. Hence, it can be assumed that amplitude variations on the received signal are noise. To eliminate such noise, it is common practice to employ an amplitude limiter between the IF stage of the receiver and the subsequent demodulator stage. The amplitude limiter operates to limit amplitude variations on the FM signal thus reducing the AM noise therein, and preventing its conversion to the baseband output by detector imperfections.

Where the strength of the information signal received is large compared to the noise in the signal, an amplitude limiter alone will usually suffice to sufficiently suppress the AM noise. However, where the information signal strength is weak compared to the noise, reduction of the AM noise by the amplitude limiter will be insufficient for quality picture reception and/or may adversely affect the weak information signal precluding proper demodulation.

As a measure of information or the ratio of modulation information to noise, it is typical to determine the carrier-to-noise ratio, or CNR. In terms of CNR, at 12 to 14 dB and higher, the amplitude limiter is sufficient to suppress AM noise. On the other hand, at CNR levels below 12 db the limiter's capability is usually not adequate to properly suppress the noise without also affecting the information signal.

As recognized in U.S. Pat. No. 3,909,725 to Baghdady, at such low CNR, the amplitude limiter's performance can be greatly improved by providing regenerative feedback around the amplitude limiter. Regenerative feedback results in improved reception by suppressing the noise without degradation of the information signal. Thus, in U.S. Pat. No. 3,909,725, there is disclosed a feedback amplifier and filter configured to provide in-phase feedback around the limiter in the frequency band of interest. Such regenerative feedback permits better reception of weaker information signals in the presence of noise, and subsequently more satisfactory demodulation for viewing purposes, than previously possible. Hence, the lower limit or threshold of CNR at which proper reception can occur is extended.

This phenomenon or technique is sometimes, therefore, referred to as threshold extension.

When regenerative feedback around the limiter is employed, the circuit will normally tend to oscillate in the absence of an input signal. Hence, a limiter having regenerative feedback is often referred to as an oscillating limiter. This self-induced oscillation has the added benefit of providing a squelch to the receiver as described in the aforesaid Baghdady patent.

Subsequent developments with oscillating limiters have been aimed at reducing the effects of unwanted high frequency or noise components. For example, in U.S. Pat. Nos. 4,035,730 and 4,101,837, oscillating limiter circuitry is described which employs an electrically tunable bandpass filter in regenerative feedback relationship around the limiter. The center frequency of the electrically tunable bandpass filter is varied by a steering signal which is generated in response to the demodulated or baseband video signal.

In U.S. Pat. No. 4,035,730, the steering signal is generated by a circuit which attenuates the higher frequency of the baseband video signal so that the center frequency of the electrically tunable bandpass filter tracks only the video modulation (information) of the signal. Thus, the electrically tunable bandpass filter is responsive to the instantaneous frequency of the FM signal, but does not respond to the higher end of the baseband signal (e.g., above 4.2 MHz), i.e., it ignores the noise therein. This is undesirable, and does not provide a satisfactory television picture.

The steering signal generated by the circuit described in the U.S. Pat. No. 4,101,837 does pass some of the higher frequency components in the video baseband to the electrically tunable bandpass filter but does so out of phase thereby still minimizing responsiveness of the filter to the noise in the baseband. Further, as did the U.S. Pat. No. 4,035,730, the steering signal causes the center frequency of the electrically tunable bandpass filter to be tuned according to the modulation or information in the FM signal. Again, this approach is not entirely satisfactory.

Accordingly, it is one objective of the present invention to provide an FM receiver with improved reception, particularly when used to receive weak information signals accompanied by substantial electrical noise.

A further objective of the present invention is to provide, in an FM receiver having an oscillating limiter circuit which is useful in satellite television ground receiving stations, enhanced picture quality and/or sound reproduction of a television signal.

These objectives are achieved by (1) tuning the center frequency of the electrically tunable bandpass filter in such a manner that it does not track the video modulation or information of the signal, and (2) causing the electrically tunable bandpass filter to be responsive, at least in part, to the noise in the demodulated signal, particularly at the higher end of the baseband signal.

With the advent of satellite communications, further problems have been encountered. Ideally, each satellite transponder which is set to a particular channel will operate at the same nominal or carrier frequency. That ideal is not always achieved. Hence the signal to be received from one satellite may be at the correct nominal frequency whereas the signal to be received from a second satellite may be offset slightly in frequency due to drift or the like. Additionally, the receiving system may operate with some unwanted frequency offset of its own due to changes caused by temperature fluctuation such as in equipment mounted at the reflector antenna.

Accordingly, a further objective of the present invention is to provide an FM receiver which can satisfactorily demodulate signals from a satellite transponder even though it is not operating at precisely its correct nominal frequency.

A yet further objective of the present invention is to provide an FM receiver which can automatically compensate for undesired frequency offsets in the receiving system.

These objectives are accomplished by causing the center frequency of the electrically tunable bandpass filter to be tuned in response to a DC component in the detected video or baseband thereby causing its center frequency to track the average frequency of the received signal over a period of time rather than the instantaneous frequency or modulation of the information signal.

As previously discussed, at high CNR, regenerative feedback around the limiter is unnecessary. Further, regenerative feedback around the limiter at high CNR may actually degrade receiver performance. Hence, in U.S. Pat. No. 4,101,837, it is proposed that the electrically tunable bandpass filter be disconnected from around the limiter when the information signal strength is above the level where threshold extension is required. While providing an on/off or go/no-go function to the regenerative feedback eliminates the degradation caused by regenerative feedback at high CNR, it does not enhance receiver performance at low CNR beyond that already known to occur as discussed in the Baghdady patent.

Accordingly, a still further objective of the present invention is to provide an FM receiver having enhanced receiver performance at low CNR.

An even further objective of the present invention is to provide in an FM receiver improved oscillating limiter circuitry meeting the foregoing objective while still effectively eliminating regenerative feedback around the limiter at high CNR and thereby avoiding degradation of receiver performance.

These objectives are accomplished by controlling the amount of regenerative feedback in inverse proportion to the CNR. Specifically, it has been discovered that varying the amount of feedback in logarithmic inverse relationship to the CNR results in a subjectively improved video picture. To that end, the FM receiver of the present invention is provided with a CNR signal generator and a variable attenuator. The variable attenuator is placed in the regenerative feedback path around the limiter, and is responsive to the CNR signal generator which generates a signal corresponding to the CNR of the FM signal, thereby varying the amount of feedback in inverse logarithmic relation to the CNR with the result that the picture is improved.

BRIEF DESCRIPTION OF THE DRAWINGS

These and other features and advantages of the invention will become more readily apparent from the following detailed description taken with the accompanying drawings in which.

DETAILED DESCRIPTION OF THE PREFERRED EMBODIMENT

Figure 1:
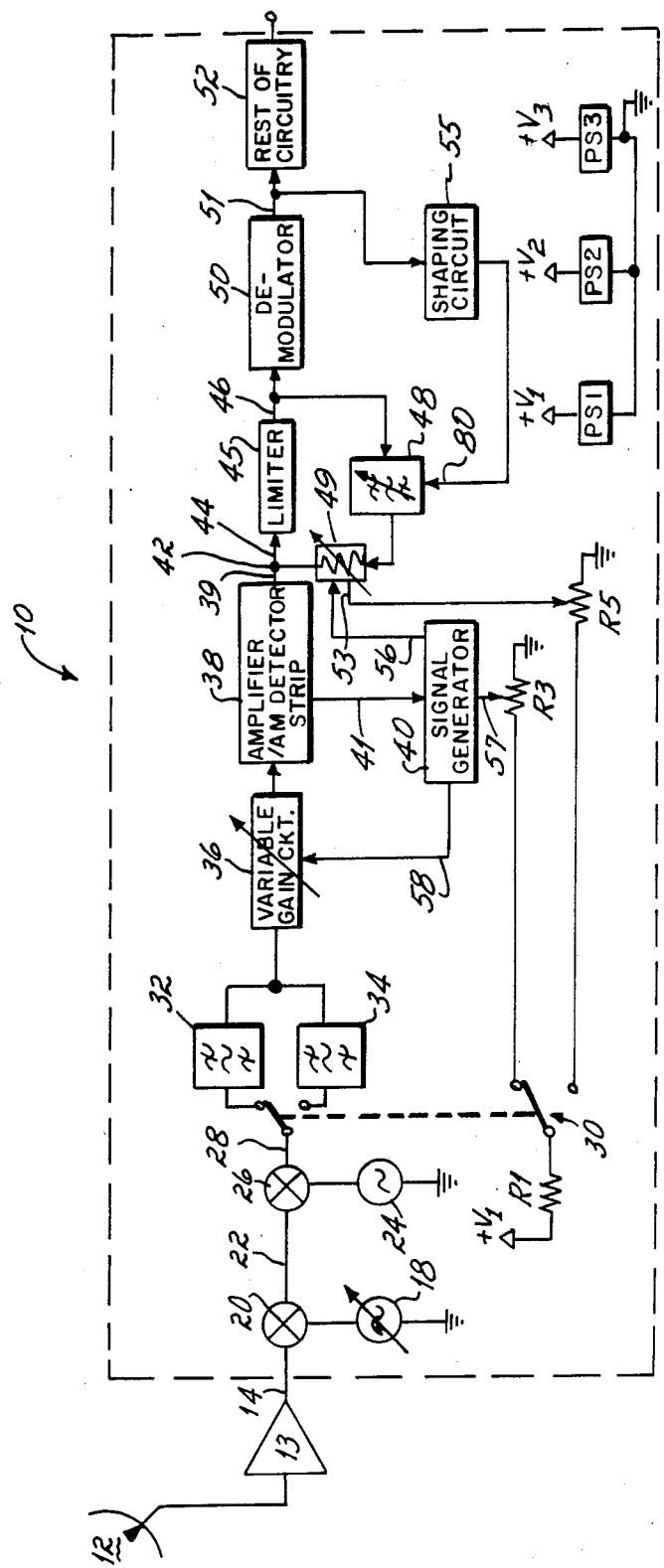
FIG. 1 is a block circuit diagram of a preferred embodiment of an FM receiver according to the present invention.

With reference to FIG. 1, there is shown a block circuit diagram of a preferred embodiment of an FM receiver 10 according to the present invention. Receiver 10 is driven by a low noise amplifier 13 which amplifies an FM signal received on reflector antenna 12. Reflector antenna 12 is sized to receive satellite transmitted television signals which are typically in the several gigahertz range. The output of low noise amplifier 13 is coupled to the input 14 of FM receiver 10.

As is conventional, the FM signal received on input 14 is mixed or heterodyned with a signal generated by a first local oscillator 18 in first mixer 20 to generate a first IF signal on output 22. The frequency of local oscillator 18 is variable so as to permit tuning of the receiver to the desired channel. The first IF signal on output 22 is preferably centered about 250 MHz. As is also conventional, the first IF signal is further mixed or heterodyned with the output of a second local oscillator 24 in mixer 26 to produce a second IF signal centered about 70 MHz on output 28.

Output 28 is selectively coupled to a narrow bandwidth 4-pole IF filter 32 or a broader bandwidth 4-pole IF filter 34 by means of switch 30. Switch 30 may be an electronic switch. IF filters 32, 34 are bandpass filters having a bandwidth of 15.75 MHz and 30 MHz, respectively. Typically, a satellite television receiver would use a 30 MHz IF filter. For reasons to be discussed, it is sometimes necessary to use a narrower IF filter as is provided by the circuitry of this invention.

The outputs of IF filter 32 and 34 are coupled to a variable gain circuit 36, the output of which is coupled to amplifier/AM detector strip 38. Amplifier/AM detector strip 38 is preferably comprised of three capacitively coupled SL1613C integrated circuits (not shown) manufactured by Plessey Solid State, Irvine, Calif., and an NPN transistor amplifier (not shown). Amplifier/AM detector strip 38 amplifies the IF signal and supplies the amplified IF signal on output 39 to the remaining circuitry to be discussed. Amplifier/AM detector strip 38 also provides an AM output 41 which drives a signal generator 40 as will be discussed.

The RF output of the last SL1613C integrated circuit (not shown) of amplifier/limiter strip 38 is coupled through the NPN transistor amplifier (not shown) thereof to provide an FM output 39 which is coupled to the input 44 of an amplitude limiter 45 at summing junction 42. The output 46 of limiter 45 drives demodulator 50. Limiter output 46 is also regeneratively fed back via summing junction 42 to limiter input 44 through the series combination of electrically tunable bandpass filter 48 and variable attenuator 49.

The output 51 of demodulator 50 is the composite video, audio subcarrier and related signals which are operated upon by the remaining FM receiver 10 circuitry (represented by block 52) of conventional design. The circuitry of the present invention is also provided with a shaping circuit 55 which is responsive to the output 51 of the demodulator 50. Shaping circuit 55 passes certain of the baseband components from demodulator 50 to electrically tunable bandpass filter 48, thereby making filter 48 responsive to the output 51 of demodulator 50, in a prescribed manner. Particularly, shaping circuit 55 passes primarily a DC component and the high frequency noise components of the baseband signals to filter 48, without passing the information components.

The DC component is an integrated response to the varying frequency output from demodulator 50 and thus is proportional to the average frequency, i.e. the center frequency, of the IF signal. Filter 48 is responsively tuned to this DC component whereby the center frequency of filter 48 corresponds to the center frequency of the IF signal corrected for frequency offsets as discussed above.

Filter 48 is also responsive to the noise component of the baseband signal. By this arrangement, correct operation of the limiter with regenerative feedback is obtained and the received picture enhanced.

A further aspect of the present invention is the provision of a signal generator 40 which is responsive to envelope output 41 of amplifier/AM detector strip 38 ("detected output" of the last SL1613C integrated circuit thereof). Signal generator 40 generates a CNR signal which is proportional to the signal or carrier-to-noise (CNR) ratio of the FM signal received on input 14 to FM receiver 10. The CNR signal is utilized to control the amount of feedback around limiter 45. To this end, variable attenuator 49 is responsive to the CNR signal via line 56 whereby the amount of energy from output 46 of limiter 45 which is regeneratively fedback therearound through filter 48 can be varied.

To determine the appropriate amount of feedback for a given CNR, the visual quality of a received television picture has been subjectively tested. The results of these tests indicated that the amount of feedback should vary inversely with changes in CNR. Specifically, these tests show that the best picture quality is obtained when the amount of feedback is inversely proportional to the logarithm of CNR. As will be discussed, signal generator 40 and variable attenuator 49 cooperate to provide this inverse logarithmic relationship between feedback and CNR.

As mentioned previously, the circuitry of this invention utilizes two IF filters 32, 34 of differing bandwidths. For typical television signals in the United States, a 30 MHz bandwidth IF filter (34) is usually appropriate. In some instances, such as with the IntelSat European communication system, the bandwidth of the information signal is narrower. Thus, it is more appropriate to use the narrower bandwidth IF filter 32. The circuitry of the present invention provides two selectable IF filters of different bandwidth to give the user the option of making the FM receiver 10 of the present invention compatible with both United States and European systems.

In some situations with U.S. television systems, the terrestrial noise may be so great as to prevent satisfactory demodulation unless some of the noise is reduced. Hence, a very poor or no picture will result. Use of a narrower IF filter as provided with the circuitry herein will reduce some of that noise. Unfortunately, some of the information signal will also be lost resulting in a less than hoped-for picture, although a better picture likely will be obtained than with the wider IF filter.

In either situation, European or high-noise United States systems, it is primarily the amount of noise passed to the remaining receiver components which will differ depending upon which IF filter 32, 34 is employed. Thus, for a given amount of information signal, the CNR will be one value with IF filter 32 and another lower value with IF filter 34. That is, for the same strength of information signal, the noise content of the FM signal will be reduced with IF filter 32 as compared to IF filter 34.

The improved oscillating limiter circuitry of the present invention, which in one of its aspects is dependent on the CNR, is responsive to the width of the IF filter selected in the IF signal path. A predetermined amount of regenerative feedback around the limiter is provided for a given CNR when wide bandwidth IF filter 34 is selected and that same amount of feedback is provided for a larger CNR (lower noise) when narrow bandwidth IF filter 32 is selected.

To accomplish the foregoing, the circuit of the present invention compensatingly adjusts signal generator 40 and variable attenuator 49 depending upon which of IF filters 32, 34 is employed in the IF signal path as determined by the position of switch 30.

When switch 30 is in a first position (indicated in FIG. 1), the IF signal path includes narrowband IF filter 32. Also, with switch 30 in the first position, input 57 of signal generator 40 is coupled to power supply PS1 through the wiper arm of potentiometer R3 due to voltage divider comprising resistor R1 and potentiometer R3. At the same time, input 53 of variable attenuator 49 is coupled to ground through the wiper of potentiometer R5. The foregoing configuration for switch 30 compensates receiver 10 for circumstances requiring narrow band IF filtering between antenna 12 and amplifier/AM detector strip 38.

When switch 30 is in a second position (not shown), the IF signal path includes wide band IF filter 34. Also, input 57 to generator 50 is, effectively, grounded through the wiper of potentiometer R3 whereas input 53 of attenuator 49 is coupled to power supply PS1 by the voltage divider now comprising resistor R1 and potentiometer R5. The foregoing configuration for switch 30 is typically utilized for United States systems to permit non-compensated operation of receiver 10 in normal operation.

Thus, as a result of the setting of switch 30 and alternative voltage dividers R1, R3 and R1, R5, the nature of the CNR signal and the amount of feedback around the limiter 45 are offset to account for the different bandwidths of alternatively connected narrow band and wide band IF filters 32, 34.

FM Receiver 10 also includes three power supplies PS1, PS2, and PS3 to provide a positive power supply of 12.0 volts, 6.0 volts and 5.2 volts, respectively. Power supplies PS1 through PS3 may be powered by a 120 volt AC line (not shown). The reference potential of all power supplies PS1 to PS3 are tied to the same point referred to herein as ground.

Figure 2:
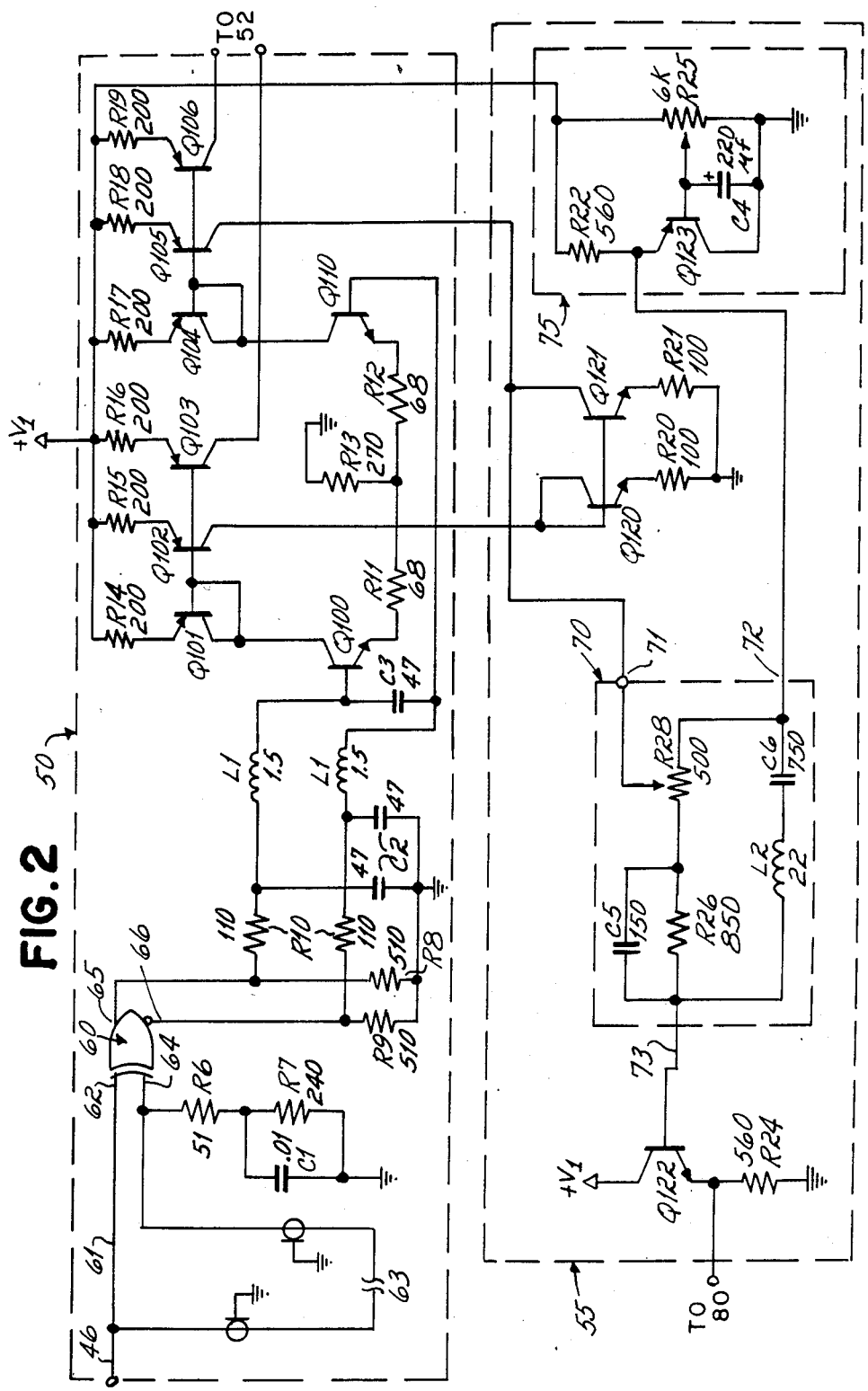
FIG. 2 is a schematic drawing of the demodulator and shaping circuit of FIG. 1.

With reference to FIG. 2, there is shown a schematic diagram of demodulator 50 and the shaping circuit 55 which is responsive thereto.

Demodulator 50 is preferably a double-balanced phase detector. The output 46 of limiter 45 (FIG. 1) is directly coupled through a first path 61 to a first input 62 of an exclusive OR/NOR logic gate 60 which is powered from power supply PS2. Output 46 is further coupled through an odd multiple quarter wave-length delay line 63, such as a piece of coaxial cable, to a second input 64 of gate 60. Input 64 of gate 60 is further coupled to ground through the two series resistors R6 and R7. Resistor R6 terminates coaxial cable 63. To that end, the junction of resistor R6 and resistor R7 is coupled to ground through capacitor C1.

Exclusive OR output 65 of gate 60 and exclusive NOR output 66 of gate 60 are resistively coupled to ground through resistors R8 and R9, respectively. Outputs 65 and 66 are further coupled to the base of NPN transistors Q100 and Q110, respectively, through identical T-networks each comprised of resistor R10, capacitor C2, and inductor L1. Further, the base of each transistor Q100 and Q110 is capacitively coupled to the other through capacitor C3. The emitters of transistors Q100 and Q110 are resistively coupled through the series combination of resistors R11 and R12, the junction of which is resistively coupled to ground through resistor R13.

Gate 60 operates in conjunction with first path 61 and delay line 63 as a phase detector, the outputs of which drive the above components (comprising a low pass filter) to couple the video and audio and related signals to transistors Q100 and Q110. The cutoff frequency of this low pass filter is set sufficiently high (e.g., 18 MHz) whereby only the undesired detector outputs components at twice the IF frequency (hence at 140 MHz) are effected. The low pass filter thus has no significant effect on the baseband, which may extend to one-half the bandwidth of the widest IF filter 34, or 15 MHz.

The collector of transistor Q100 is directly coupled to the collector and base of a first PNP transistor Q101 and also to the bases of second and third PNP transistors Q102 and Q103, respectively, which functions as current mirrors. Similarly, the collector of transistor Q110 is directly coupled to the collector and base of fourth PNP transistor Q104 and to the bases of fifth and sixth PNP transistors Q105 and Q106, respectively.

The emitters of all six transistors Q101 through Q106 are resistively coupled to power supply PS1 by resistors R14 through R19, respectively.

The collectors of transistors Q103 and Q106 provide a differential video output or baseband signal to the remaining circuitry (box 52) of FM receiver 10. The collectors of transistors Q102 and Q105 similarly provide a differential video output signal to drive shaping circuit 55. By provision of transistors Q103, Q106 on the one hand, and transistors Q102, Q105 on the other, it is possible to provide a differential video output for the remaining circuitry 52 of FM receiver 10, and to drive the shaping circuit 55 with identical differential video outputs while maintaining isolation between shaping circuit 55 and the remaining circuitry 52.

With respect to the shaping circuit 55, one of the video outputs, the collector of transistor Q102, is directly coupled to the collector and the base of NPN transistor Q120 and further to the base of current mirror NPN transistor Q121. The other video output, the collector of transistor Q105, is directly coupled to the collector of transistor Q121 and to the video input 71 of filter 70. The emitters of transistors Q120 and Q121 are each resistively coupled to ground by resistors R20 and R21, respectively. This configuration results in a single-ended video or baseband signal on video input 71.

Filter 70 is driven by video input 71 and DC input 72 to drive NPN transistor Q122 from output 73. The collector of transistor Q122 is coupled to power supply PS1, and the emitter thereof resistively coupled to ground through resistor R29. The emitter of transistor Q122 is further coupled to the input 80 of electrically tunable bandpass filter 48 for tuning purposes.

DC input 72 is coupled to DC adjust circuit 75 by which the center frequency of electrically tunable bandpass filter 48 can be manually adjusted at the factory to the nominal 70 MHz center frequency thereof for proper operation in the field.

DC adjust circuit 75 includes resistor R22, variable voltage divider potentiometer R25, capacitor C4 and PNP transistor Q123. The collector of transistor Q123 is grounded, and the base thereof capacitively coupled to ground through capacitor C4 and to variable voltage divider R25 through the wiper arm thereof. The emitter of transistor Q123 is resistively coupled to power supply PS1 through resistor R22 and by adjustment of the wiper arm of potentiometer R24 provides a variable DC bias on input 72 of filter 70 to vary the bias transistor Q122. The operating point of electrically tunable bandpass filter 48 is responsive to transistor Q122 thus making the nominal operating point or center frequency of filter 48 dependent upon the setting of DC adjust circuit 75.

Transistor Q122 (and hence filter 48) is also responsive to filter 70 which is configured according to the principles of this invention. Filter 70 is comprised of parallel network capacitor C5 and resistor R26 in series with potentiometer R28, all of which is in parallel with the series branch of capacitor C6 and inductor L2. The video input 71 of filter 70 is coupled to potentiometer R28 through the wiper arm thereof. Filter 70, particularly, provides a shaping function to the demodulated video signal, so as to drive the electrically tunable bandpass filter 48 in accordance with the principles of the present invention.

Figure 3:
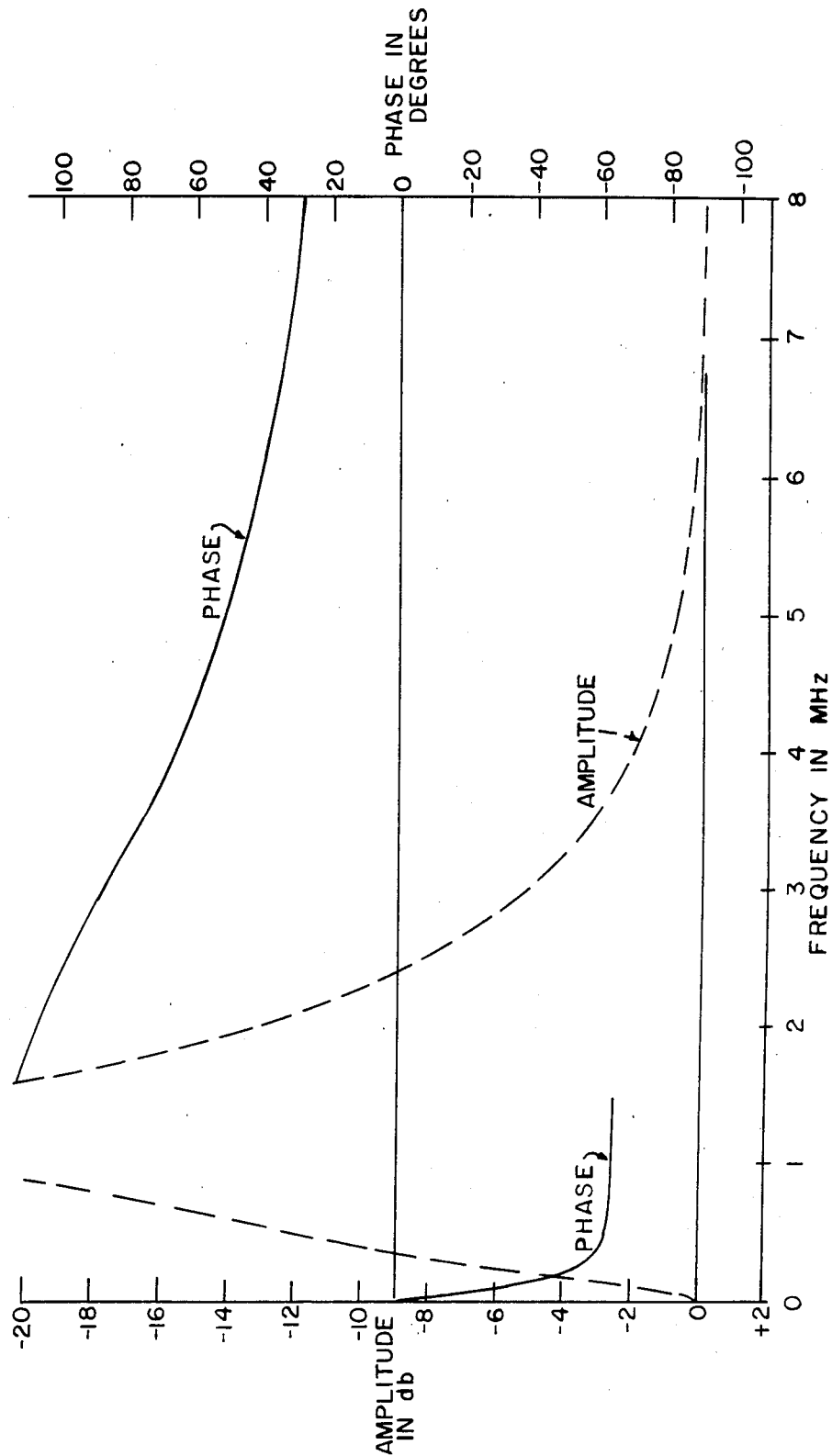
FIG. 3 is a graph of the amplitude and phase response of the shaping circuit of FIG. 2.

To that end, reference is had to FIG. 3 which is a graph of the amplitude and phase response of filter 70 of shaping circuit 55. As seen in FIG. 3, a DC component of the detected video and the higher frequency or noise components above 4.2 to 5.0 MHz are passed to transistor Q122 both in terms of amplitude (between 0 and −2 dB) and of phase (within approximately ±45°). It has been determined that this filter function corresponds substantially to the inverse of a noise weighting function as set out in CCIR Recommendation 567, Recommendations and Reports of the CCIR, 1982, XVth Plenary Assembly, Geneva 1982 (International Telecommunication Union), incorporated herein by reference, e.g., a filter which passes noise at frequencies that are not subjectively objectionable in television systems.

The frequency response curve of filter 30 above 1 MHz is easily identified as a high pass response from FIG. 3, with a lower 3 dB point at approximately 3.6 MHz. While the frequency response returns to unity at DC, it is 3 dB down at approximately 150 KHz, allowing less than 1/24 of the energy of a rejection band below 3.6 MHz to be passed.

Typically, the video signal being processed had been pre-emphasized by the transmitter in accordance with CCIR Recommendation 405-1. This preemphasis consists of (for NTSC or 525 line video) a shelving effect of 13 dB beginning at 187 KHz, and stabilizing at its final value at 875 KHz. The filter, as currently implemented, is approximately 4 dB down at 187 KHz, and approximately 20 dB down at 875 KHz, substantially the inverse of the pre-emphasis slope. Thus, noise power due to the return at DC is limited to an insignificant 1/24 of that rejected by the high pass nature of the filter (−14 dB), and signal modulation components are further attenuated by the pre-emphasis shelving to a level of approximately −27 dB (1/494 of power).

Finally, the phase response is substantially that expected of a high pass network in the higher, pass band region, approaching 0° in an asymptotic manner, from an initially leading phase respective.

Thus, filter 70 attenuates and/or presents out of phase most of the information signal to electrically tunable bandpass filter 48. As a result, the center frequency of electrically tunable bandpass filter 48 is tuned in such a manner that it does not track the video modulation or information of the signal. Rather, electrically tunable bandpass filter 48 is responsive, at least in part, to the noise in the demodulated signal, particularly at the higher end of the baseband signal. Additionally, the center frequency of electrically tunable bandpass filter 48 is tuned in response to a DC component in the detected video thereby causing its center frequency to track the average frequency of the received signal over a period of time rather than the instantaneous frequency or video modulation of the information signal.

The DC component from shaping circuit 55 is an integrated response to the varying frequency output from the demodulator 50 and thus presents a DC value reflective of the average or center frequency over time (which corresponds to the carrier frequency) as seen by the demodulator 50. Where that average frequency is offset from what is ideally expected, the DC voltage generated in filter 70 and passed proportionately through transistor Q122 will cause the center frequency of the electrically tunable bandpass filter 48 to move in a direction toward the actual center or carrier frequency of the FM signal (actually to the true center frequency of the IF signal if it is offset from the expected 70 MHz). Hence, frequency offsets due to improper operation of the satellite and/or fluctuations caused in the receiving circuitry such as at the reflector antenna are compensated in a manner analagous to automatic fine tuning as is well understood.

Further, the electrically tunable bandpass filter 48 is responsive, at least in part, to the noise in the video signal as seen on the collectors of transistors Q102 and Q105. As shown in FIG. 3, the amplitude and phase response of filter 70 causes a great deal of the higher frequency energy to be coupled to electrically tunable bandpass filter 48. It is in these higher bands of frequency that noise is predominant. As seen from FIG. 3, at the higher end of the baseband, signals passed by filter 70 are not greatly reduced in amplitude and are nearly in phase thus passing most of the noise energy to electrically tunable bandpass filter 48. As yet, the reason(s) for successful operation when the electrically tunable bandpass filter 48 is responsive to noise in the video signal is unexplained.

Thus there is provided in an FM receiver an improved oscillating limiter comprising a limiter adapted to receive an FM signal, a demodulator coupled to the output of the limiter for providing signals corresponding to the modulation of the FM signal including the noise therein, and an electrically tunable filter in regenerative feedback relationship across the limiter, wherein the tunable filter is responsive to the noise or high frequency components in the demodulator output signal. The electrically tunable band pass filter is further responsive to a DC component generated by averaging the demodulator output signal over a period of time.

Figure 4:
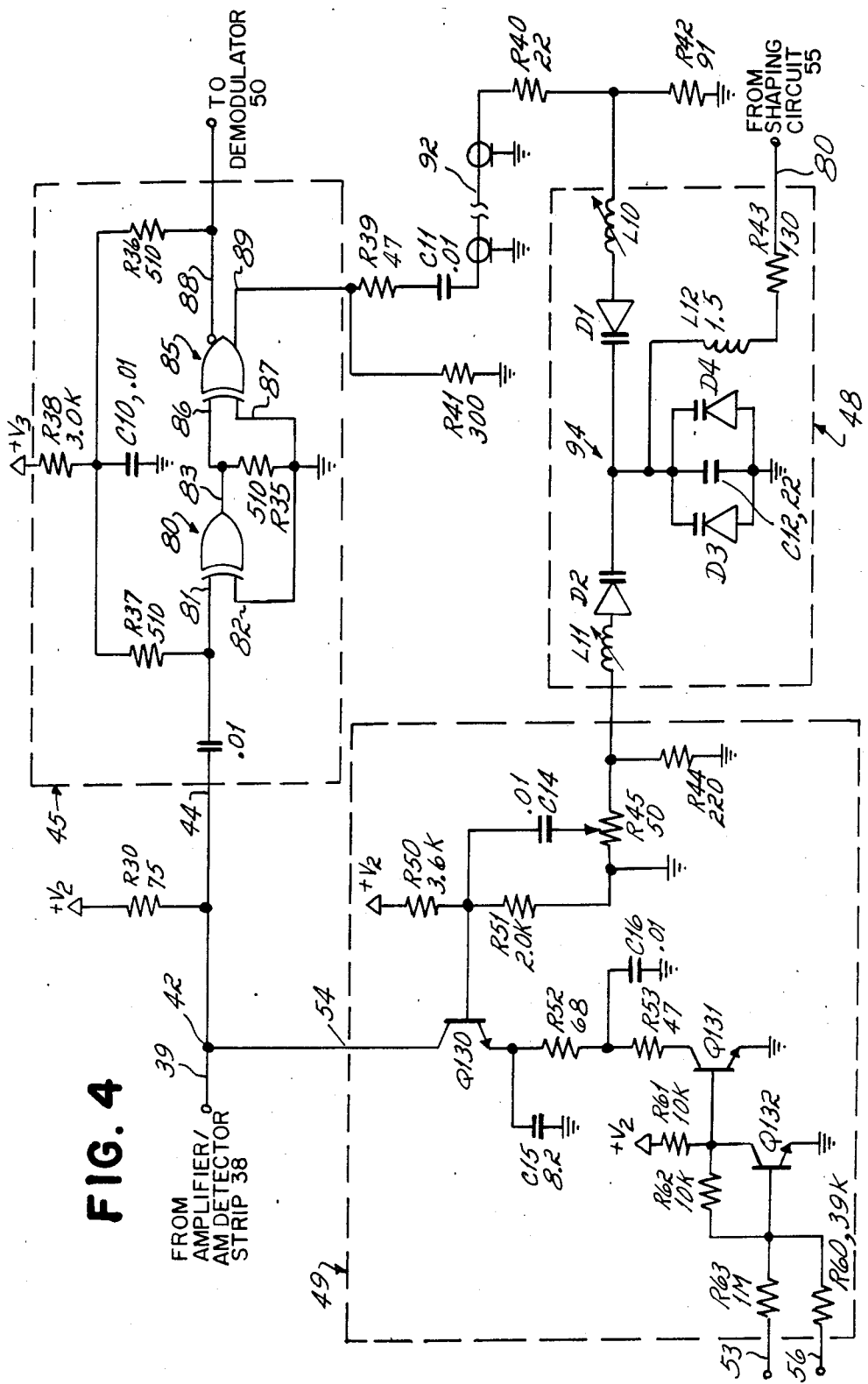
FIG. 4 is a schematic drawing of the limiter, electrically tunable bandpass filter and variable attenuator of FIG. 1.

As mentioned previously, the present invention also provides for enhanced operation at low CNR with signal generator 40 and variable attenuator 49. With reference to FIG. 4, there is schematically shown the limiter 45, electrically tunable bandpass filter 48, and variable attenuator 49 all of which comprise an oscillating limiter in accordance with the principles of the present invention.

Output 39 of amplifier/AM detector strip 38 (FIG. 1) and the output 54 of variable attenuator 49 are summed at junction 42 drive input 44 of limiter 45. Input 44 is capacitively coupled to a first input 81 of exclusive OR gate 80 which is powered by power supply PS3. A second input 82 of gate 80 is coupled to ground. Summing junction 42 is resistively coupled to power supply PS2 by resistor R30.

The output 83 of gate 80 is coupled to ground through resistor R35 and is further coupled to a first input 86 of exclusive OR/NOR gate 85 also powered by power supply PS3. A second input 87 of gate 85 is grounded.

Exclusive NOR output 88 of gate 85 is coupled to demodulator 50 and to input 81 of gate 80 through the series combination of resistor R36 and resistor R37. The junction of resistors R36 and R37 is coupled to ground by capacitor C10 and to power supply PS1 by resistor R38. This DC feedback serves to maintain the operation of gates 80 and 85 in the approximate center of their transition region.

Exclusive OR output 89 of exclusive gate 85 is coupled to electrically tunable bandpass filter 48 through a series combination of resistor R39, capacitor C11, delay line (coaxial cable) 92 and resistor R40. The junction of output 89 and resistor 39 is resistively coupled to ground by resistor R41. Similarly, the input to electrically tunable bandpass filter 48 is coupled to ground through resistor R42.

Electrically tunable bandpass filter 48 includes the series connection of inductor L10, varactor diode D1, varactor diode D2, and inductor L11. The cathodes of varactor diodes D1 and D2 are connected in common at node 94. Connected in parallel between node 94 and ground is capacitor C12 and two varactor diodes D3 and D4. The cathodes of varactor diodes D3 and D4 are also connected in common at node 94. Varactor diodes D1 through D4 are DKV-6520A matched diodes available from Alpha Industries, Inc., Woburn, Massachusetts. Also coupled to node 94 is the output of shaping circuit 55 through the series combination of inductor L12 and resistor R43 whereby filter 48 is responsive to shaping circuit 55.

The output of electrically tunable bandpass filter 48 is coupled to ground through through potentiometer R45 and R44. The wiper arm of potentiometer R45 is capacitively coupled by capacitor C14 to the base of NPN transistor Q130. The collector of transistor Q130 is the output 54 of attenuator 49. Transistor Q130 is configured to operate like a variable transconductance as will be discussed below.

The base of transistor Q130 is biased by a voltage divider comprised of resistors R50 and R51 in series from power supply PS2. The emitter of NPN transistor Q130 is resistively coupled to the collector of NPN transistor Q131 through series resistors R52 and R53. Also, the emitter of NPN transistor and the junction of resistors R52 and R53 are each capacitively coupled to ground through capacitors C15 and C16, respectively, while the emitter of transistor Q131 is grounded directly.

Figure 5:
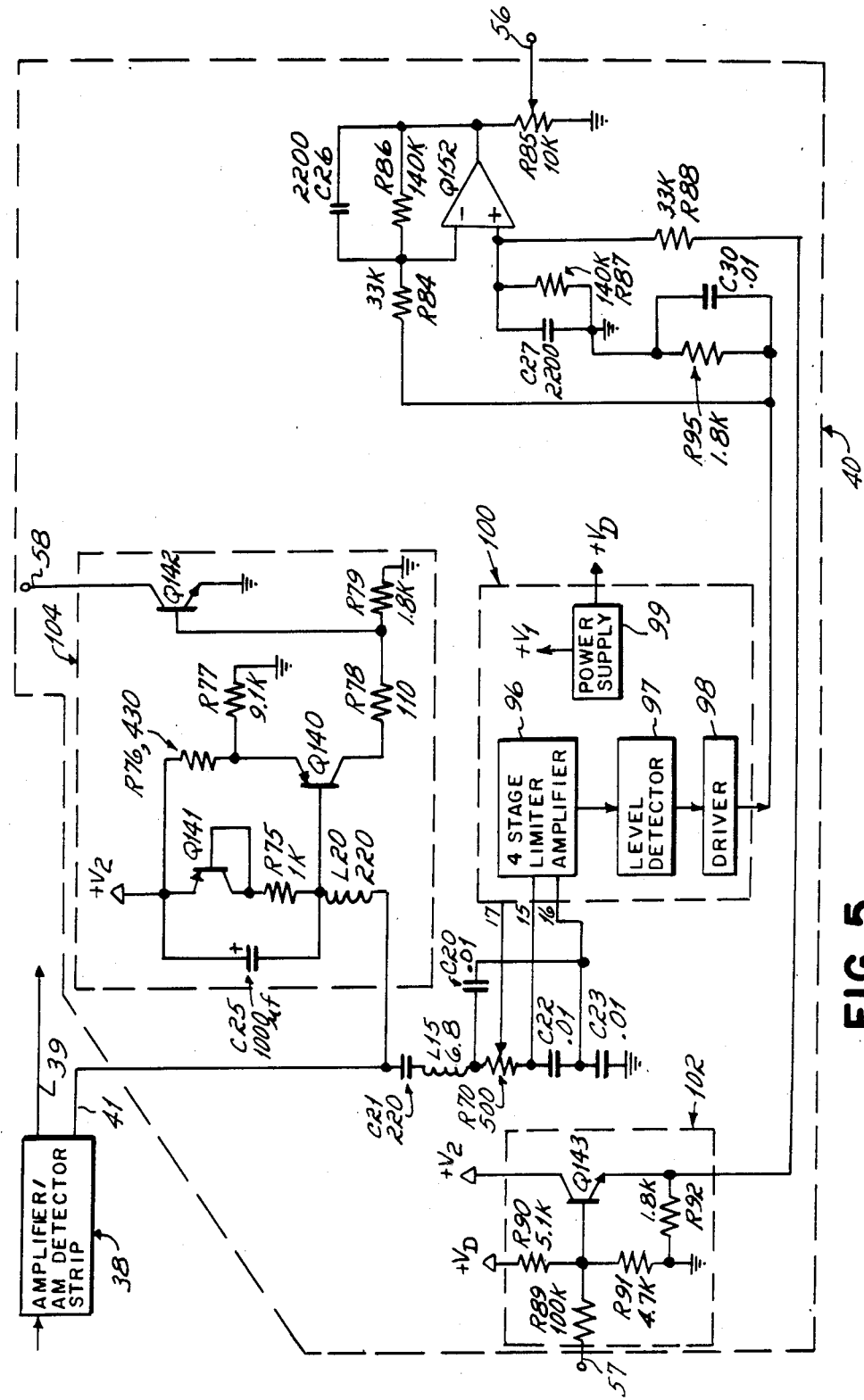
FIG. 5 is a schematic drawing of a preferred signal generator for generating the CNR signal to control the variable attenuator of FIG. 4.

By virtue of the foregoing arrangement, and because the signal to attenuator 49 is fully limited, transistor Q130 behaves like a variable transconductance between filter 48 and summing junction 42. The effective $g_m$ of transistor Q130 can be varied by varying the DC voltage applied to the base of transistor Q131. Thus, the transconductance of transistor Q130 will change thereby varying the amount of attenuation of the signal passing from the base to the collector of transistor Q130. To obtain the logarithmic proportionality desired, the logarithmic nature of a transistor's operation is advantageously employed with transistor Q131 whereby the $g_m$ of transistor Q130 will vary logarithmically even though the CNR signal on line 56 is a voltage that is linearly proportional to CNR in dB (see FIG. 5). Hence, the amount of feedback will increase (decrease) by an approximately constant number of dB for each dB decrease (increase) in CNR.

To drive transistor Q131, line 56 (CNR signal) is resistively coupled to the base of NPN transistor Q132 through resistor R60. The collector of transistor Q132 is powered from power supply PS2 through resistor R61 which also biases transistor Q131 into the "on" state. The collector of transistor Q132 is thus coupled to the base of transistor Q131 and is further resistively coupled to its own base through resistor R62.

The signal on input 56 causes transistors Q132 and Q131 to vary their point of operation thus varying the $g_m$ of transistor Q130. Similarly, input 53 of attenuator 49 is resistively coupled to the base of transistor Q132 through resistor R63 to vary the $g_m$ of transistor Q130 in accordance with the bandwidth of the IF filter selected by switch 30.

As the signal applied to the base of transistor Q132 increases, the base of transistor Q131 approaches ground potential tending to cut-off or decrease current flow through transistor Q131. Hence, as CNR increases, the current through transistor Q131 (current to emitter) will decrease thereby decreasing the transconductance of transistor Q130. Above approximately 12 dB CNR (with wide IF filter 34), the feedback path is effectively removed from around limiter 45 as transistor Q130 takes on such a low transconductance as to make the feedback energy negligible. The reverse is also true. As CNR decreases, the transconductance of transistor Q130 increases thereby increasing the amount of regenerative feedback around limiter 45. Emitter degeneration resistor R52, in combination with peaking capacitor C15, serve to limit the maximum transconductance of transistor Q130 that may be obtained at very weak signal levels. This limit is typically reached at less than 4 dB CNR, and is preferably chosen to fall at or below the CNR at which the signal, after the improvement achieved by the principles of this invention, remains subjectively too poor in quality to be of commercial value.

Thus, there is provided in the FM receiver, attenuator means in the feedback path around the limiter for varying the amount of regenerative feedback in inverse logarithmic proportion to the CNR. To this end, as discussed, the receiver 10 of the present invention is provided a signal generator 40, shown schematically in FIG. 5, which provides a CNR signal to drive the attenuator 49.

As mentioned previously, the envelope output 41 of amplifier/AM detector strip 38 drives signal generator 40. Output 41 is coupled to the series combination of a 4-stage limiter-amplifier 96, a successive approximation level detector 97 and a driver 98 all of which are part of a TDA1576 integrated circuit (IC) 100 manufactured by Signetics Corp., Sunnyvale, California.

When using IC 100, powered by power supply PS1, the following circuit configuration is utilized. Output 41 of strip 38 is coupled to pin 17 of IC 100 through the series combination of capacitor C21, inductor L15, and the wiper arm of potentiometer R70. Pin 17 is further capacitively coupled to ground through capacitors C22 and C23. Pin 16 is capacitively coupled to the junction of inductor L15 and potentiometer R70 and is directly coupled to the junction of capacitors C22 and C23. Pin 15 of IC 100 is coupled to the junction of potentiometer R70 and capacitor C22.

Capacitor C20 and inductor L15, in particular, have a low pass filter response with an 18 MHz cutoff to drive IC 100. This assures that the CNR signal is comprised only of signal and noise within the baseband and not from extraneous noise outside the baseband arising from harmonics or other sources.

IC 100 includes an internal power supply 99 which, in part, powers circuit 102. Circuit 102 and the output of IC 100 cooperate to provide the CNR signal as will be discussed. Hence, by powering circuit 102 from power supply 99, the effects of temperature on IC 100 are compensated for as is well understood. Circuit 102 is part of the circuitry utilized by the present invention to account for the differing CNR depending on which IF filter is selected by switch 30. To this end, circuit 102 is responsive to the position of switch 30.

Signal generator 40 generates a gain control output 58 which varies the gain of variable gain circuit 36 thereby stabilizing the envelope level seen on output 41 of strip 38 to benefit the accuracy of signal generator 40 in the manner of an automatic gain control as is understood. To that end, output 41 is further coupled to gain control circuit 104 which provides a level adjustment on output 58 to the variable gain circuit 36. Output 58 may also drive a variable attenuator or gain circuit (not shown) on the input side of IF filters 32, 34.

With respect to the details of circuit 104, output 41 is inductively coupled to the base of PNP transistor Q140 through inductor L20. The base of transistor Q140 is also coupled to power supply PS2 through capacitor C25 and through the series combination of resistor R75 and PNP transistor Q141 configured as a diode. The emitter of transistor Q140 is biased by the voltage divider comprised of resistors R76 and R77. The output collector of transistor Q140 is resistively coupled to ground through resistors R78 and R79, the junction of which is coupled to the base of NPN transistor Q142. The emitter of transmitter Q142 is grounded. The collector of transistor Q142 provides the output 58.

The CNR signal is generated by IC 100 with reference to a DC level as determined by circuit 102. To this end, the output of IC 100 is resistively coupled to the inverting input of amplifier Q152 through resistor R84. The output of IC 100 is also coupled to ground through parallel network capacitor C35 and resistor R90. Amplifier Q152 provides a CNR signal output 56 through the wiper arm of potentiometer R85 which resistively couples the output of amplifier Q152 to ground.

The output of amplifier Q152 is fed back to its non-inverting input through the parallel network comprised of resistor R86 and capacitor C26.

The non-inverting input of amplifier Q152 is coupled to ground through the parallel network of resistor R87 and capacitor C27 and is further resistively coupled to the output of circuit 102 by resistor R88.

As mentioned previously, circuit 102 provides an offset to the CNR signal to compensate for the difference in bandwidth between IF filter 32 and IF filter 34. The offset, as mentioned previously, is provided by potentiometer R3, the wiper arm of which is resistively coupled to the base of NPN transistor Q143 through resistor R89. The base of transistor Q143 is also biased by voltage divider resistors R90 and R91 which are powered from power supply 99 ($+V_D$) of circuit 100. The emitter of transistor Q143 is resistively coupled to ground through resistor R92. The collector of transistor Q143 is connected to power supply PS1.

With switch 30 in the second position, the input 57 to circuit 102 is drawn to ground. Hence, the noninverting input of amplifier Q152 is provided a predetermined voltage and will operate to provide a CNR signal at 56. With switch 30 in the first position, input 57 to circuit 102 is at a positive voltage. As a result, the noninverting input of amplifier Q152 is provided a more positive voltage than before thus offsetting output 56. Output 56 will thus be at a higher DC voltage than would otherwise occur, resulting in a boost to the CNR signal to compensate for the narrower bandwidth of IF filter 31 which would otherwise result in a lower CNR signal than desired.

In operation, FM signals received on input 14 will be super-heterodyned to a 70 MHz IF signal and then filtered through one of two IF filters. The filtered IF signal will be amplified and the amplified IF signal processed by the oscillating limiter and demodulator to provide a baseband signal to the rest of the circuitry. The IF signal will also have stripped from it the AM noise component to drive a signal generator. In the oscillating limiter, the amount of regenerative feedback will be determined by the signal generator which generates a CNR signal reflective of the carrier-to-noise ratio of the received FM signal. Further, the oscillating limiter will be tuned in response to the demodulated video or baseband signal in a predetermined manner. The foregoing cooperate to improve the quality of the information signal resulting in improved picture quality.

The foregoing thus describes an FM receiver adapted to receive an FM signal and including at least one local oscillator and at least one mixer to mix the FM signal and local oscillator signal to produce an IF signal. The envelope of the IF signal drives a signal generator which generates a CNR signal proportional to the carrier to noise ratio of the FM signal received. The IF signal (which itself is an FM signal) drives an oscillating limiter comprised of a limiter and in regenerative feedback relationship around the limiter an electrically tunable bandpass filter and variable attenuator in series. The output of the oscillating limiter drives a demodulator which provides a video signal. The video signal is shaped to pass a DC component and the high frequency components of the baseband signal but not the information components thereof to the electrically tunable bandpass filter whereby said filter is responsive to the DC and noise components of the baseband signal. The variable attenuator is responsive to the CNR signal to vary the amount of feedback around the limiter in inverse proportion to variations in the CNR signal.

Although not shown in the Figures, it is to be understood that the positive power supply lines should be bypassed to ground by several 0.01 microfarad capacitors as is well known. Further, the power supply lines should be provided with impedances comprised of a ferrite bead or the like surrounding each positive power supply line as is known to suppress electromagnetic interference.

All capacitances are in picofarads except those marked in microfarads and those indicated to be 0.01", the latter also being in microfarads. All inductances are given in microhenries and resistances in ohms. Finally, gates 60, 80 and 85 comprise an MC10H107P integrated ECL circuit manufactured by Motorola Semiconductor Products, Phoenix, Arizona.

While the invention has been described in connection with reception of satellite transmitted television signals, in its broader aspects, the invention is applicable to the reception of FM signals generally.

Having described the invention, what is claimed is:

1. An FM receiver including:
   a limiter adapted to receive on a first input an FM signal having a predetermined center frequency, said limiter having a first output;
   demodulator means having a second input coupled to said limiter output for providing on a second output signals corresponding to the baseband modulation of said FM signal including the information and the noise therein;
   signal shaping means responsive to said demodulator means output signals for providing a first control signal component relatively highly correlated to the noise in said baseband modulation, said first control signal component having a relatively low correlation to said information in said baseband modulation; and
   electrically tunable bandpass filter means connected between said limiter output and said limiter input to provide regenerative feedback around said limiter, said electrically tunable bandpass filter means being responsive to said first control signal component whereby said electrically tunable bandpass filter means is tuned, in part, by said noise.

2. The FM receiver of claim 1 wherein said received FM signal may have a center frequency offset in frequency from said predetermined center frequency, said signal shaping means further providing a second control signal component correlated to the average frequency over time of said received FM signal, said electrically tunable bandpass filter means further being responsive to said second control signal component whereby the center frequency of said electrically tunable bandpass filter means is tuned to correspond to the center frequency of said FM signal adjusted for said frequency offsets thereof.

3. The FM receiver of claim 1 further comprising:
   variable attenuator means between said limiter output and said limiter input and in series with said electrically tunable bandpass filter means for varying the amount of regenerative feedback around said limiter;
   signal generator means responsive to said FM signal for generating a CNR signal proportional to the carrier-to-noise ratio of said FM signal, said variable attenuator means being responsive to said CNR signal whereby the amount of said regenerative feedback around said limiter is varied in inverse proportion to variations in said CNR signal.

4. The FM receiver of claim 2 further comprising:
   variable attenuator means between said limiter output and said limiter input and in series with said electrically tunable bandpass filter means for varying the amount of regenerative feedback around said limiter;
   signal generator means responsive to said FM signal for generating a CNR signal proportional to the carrier-to-noise ratio of said FM signal, said variable attenuator means being responsive to said CNR signal whereby the amount of said regenerative feedback around said limiter is varied in inverse proportion to variations in said CNR signal.

5. An FM receiver including:
   a limiter adapted to receive on a first input an FM signal having a center frequency, said limiter having a first output;
   demodulator means having a second input coupled to said limiter output for providing on a second output signals corresponding to the baseband modulation of said FM signal including the information and the noise therein;
   signal shaping means responsive to said demodulator means output signal for providing a first control signal component correlated to the average frequency over time of said received FM signal; and
   electrically tunable bandpass filter means coupled between said limiter output and said limiter input to provide regenerative feedback around said limiter, said electrically tunable bandpass filter means being responsive to said first control signal component whereby the center frequency of said electrically tunable bandpass filter means is tuned to correspond to the center frequency of said FM signal;
   variable attenuator means between said limiter output and said limiter input and in series with said electrically tunable bandpass filter means for varying the amount of regenerative feedback around said limiter;
   signal generator means responsive to said FM signal for generating a CNR signal proportional to the carrier-to-noise ratio of said FM signal, said variable attenuator means being responsive to said CNR signal whereby the amount of said regenerative feedback around said limiter is continuously varied in inverse proportion to varations in said CNR signal.

6. An FM receiver including:
   a limiter adapted to receive an FM signal on a first input, said limiter having a first output;
   demodulator means having a second input coupled to said limiter output for providing on a second output signals corresponding to the modulation of said FM signal including the noise therein;
   variable feedback means coupled between said limiter output and said limiter input to provide a variable amount of regenerative feedback around said limiter;
   signal generator means responsive to said FM signal for generating a CNR signal proportional to the carrier-to-noise ratio of said FM signal, said variable feedback means being responsive to said CNR signal whereby the amount of said regenerative feedback around said limiter is continuously varied in inverse proportion to variations in said CNR signal.

7. The FM receiver of claim 6 wherein said proportion is logarithmic.

8. The FM receiver of claim 6 further including IF filter means for filtering said FM signal before it is received by said limiter, said IF filter means selectively having at least a first bandwidth and a second bandwidth being narrower than said first bandwidth; switch means for selectively determining which of said bandwidths of said IF filter means is selected; said variable feedback means further being responsive to said switch means whereby there is the same predetermined amount of regenerative feedback around said limiter at a first predetermined carrier-to-noise ratio when said first bandwidth of said IF filter means is selected as at a second higher predetermined carrier-to-noise ratio when said second bandwidth of said IF filter means is selected.

9. The FM receiver of claim 7 wherein said variable feedback means is effectively removed from around said limiter at approximately 12 dB CNR and higher whereby said amount of regenerative feedback is negligible.

10. The FM receiver of claim 6 wherein said variable feedback means includes an electrically tunable bandpass filter, and said FM receiver further including signal shaping means responsive to said demodulator means output signals for providing tuning signals, said electrically tunable bandpass filter being responsive to said tuning signals.

11. The FM receiver of claim 10 wherein said proportion is logarithmic.

12. The FM receiver of claim 10 further including IF filter means for filtering said FM signal before it is received by said limiter, said IF filter means selectively having at least a first bandwidth and a second bandwidth being narrower than said first bandwidth; switch means for selectively determining which of said bandwidths of said IF filter means is selected; said variable feedback means further being responsive to said switch means whereby there is the same predetermined amount of regenerative feedback around said limiter at a first predetermined carrier-to-noise ratio when said first bandwidth of said IF filter means is selected as at a second higher predetermined carrier-to-noise ratio when said second bandwidth of said IF filter means is selected.

13. The FM receiver of claim 11 wherein said variable feedback means is effectively removed from around said limited at approximately 12 dB CNR and higher whereby said amount of regenerative feedback is negligible.

14. A method of demodulating FM signals having a center frequency and having weak information content in the presence of strong noise comprising:
amplitude limiting the FM signal through a limiter;
regeneratively feeding back from an output of the limiter and through a feedback circuit to the input of the limiter, the amplitude limited FM signal;
demodulating the amplitude limited FM signal to generate a baseband signal including the information and the noise therein;
shaping said baseband signal to provide a control signal having a first component relatively highly correlated to the noise in said baseband signal, said first component having a relatively low correlation to said information in said baseband signal;
tuning the feedback circuit in response to said control signal whereby said feedback circuit is tuned, in part, by said noise.

15. The method of claim 14 further comprising:
shaping said baseband signal to provide said control signal further having a second component correlated to the average frequency over time of said baseband signal whereby said feedback circuit is further tuned to correspond to the center frequency of said FM signal.

16. The method of claim 15 further comprising:
generating a CNR signal proportional to the carrier-to-noise ratio of said FM signal;
varying the amount of feedback passed by said feedback circuit in inverse logarithmic relationship to said CNR signal.

* * * * *

UNITED STATES PATENT AND TRADEMARK OFFICE
CERTIFICATE OF CORRECTION

PATENT NO. : 4,679,247

DATED : July 7, 1987

INVENTOR(S) : Clyde Washburn, Jr.

It is certified that error appears in the above-identified patent and that said Letters Patent is hereby corrected as shown below:

Column 15, lines 8 & 9, "37 0.01"" should be -- ".01" -- .

Column 18, line 6, "limited" should be -- limiter -- .

Signed and Sealed this

Eighth Day of December, 1987

Attest:

DONALD J. QUIGG

*Attesting Officer*   *Commissioner of Patents and Trademarks*